United States Patent [19]

Nowicki et al.

[11] Patent Number: 4,513,905
[45] Date of Patent: Apr. 30, 1985

[54] INTEGRATED CIRCUIT METALLIZATION TECHNIQUE

[75] Inventors: Ronald S. Nowicki, Sunnyvale, Calif.; John F. Moulder, Sun Fish Lake, Minn.

[73] Assignee: The Perkin-Elmer Corporation, Norwalk, Conn.

[21] Appl. No.: 586,906

[22] Filed: May 9, 1984

Related U.S. Application Data

[63] Continuation of Ser. No. 518,728, Jul. 29, 1983, abandoned, which is a continuation of Ser. No. 244,568, Mar. 17, 1981, abandoned.

[51] Int. Cl.³ .................... B23K 1/20; H01L 21/285
[52] U.S. Cl. .................................. 228/123; 228/124; 204/192 SP; 204/192 F
[58] Field of Search .................. 228/123, 124, 121; 204/192 SP, 192 C, 192 F

[56] References Cited

U.S. PATENT DOCUMENTS

| | | | |
|---|---|---|---|
| 3,609,471 | 9/1971 | Seace et al. | 228/124 X |
| 3,624,894 | 12/1971 | Miller | 228/121 |
| 3,649,803 | 3/1972 | Desmond et al. | 228/124 X |
| 3,651,562 | 3/1972 | Hambleton | 228/123 |
| 3,923,470 | 12/1975 | Damsteeg et al. | 228/200 |
| 4,023,725 | 5/1971 | Ivett et al. | 228/123 |
| 4,420,110 | 12/1983 | McCullough et al. | 228/215 X |

OTHER PUBLICATIONS

Pepper "Shear Strength of Metal—$SiO_2$ Contacts", NASA Technical Memo—78838, 11/6/1980.

Primary Examiner—Kenneth J. Ramsey
Attorney, Agent, or Firm—Randall G. Wick; Thomas P. Murphy; Edwin T. Murphy

[57] ABSTRACT

A process in the manufacture of integrated circuits in which a barrier layer of Cr or Ti is deposited in a partial atmosphere of $N_2$ in an Ar sputtering gas on a layer of Si so that the $N_2$ is incorporated in the Cr or Ti, after which conductor material such as gold, silver, low temperature eutectic or other high temperature solders, are deposited on the barrier layer. This barrier layer reduces migration of Si and Cr through and over the conductor material so that a wettable (bondable) surface is provided which results in greater bond strength and greater reliability when the die is attached to a bonding pad by the conventional heat treat method.

12 Claims, 6 Drawing Figures

INTEGRATED CIRCUIT METALLIZATION TECHNIQUE

This application is continuation of application Ser. No. 518,728, filed July 29, 1983 (abandoned), which is a continuation of application Ser. No. 244,568, filed Mar. 17, 1981 (abandoned).

BACKGROUND OF THE INVENTION

This invention relates, in the broadest sense, to the fabrication of integrated circuit dice (chips), and, more specifically, to an improvement in the metallization technique for forming conductors on said dice so as to improve the conductor, or die attachment surface wettability (bondability) to other conductors or surfaces to form reliable physical or electrical connections therebetween.

An example of the application of this invention will be described in connection with the attachment of a silicon die to a bonding pad of a ceramic package in which the die is to be contained, although other applications of this invention will become apparent to those skilled in the art from the following description.

Integrated circuit dice are presently packaged, in many instances, in ceramic type packages which have external leads to connect the packages to other circuitry. Each die is physically bonded to the package either by an epoxy or by metallurgical bonding to form an electrical or physical contact with the die. A present method of making this electrical or physical contact is to deposit a thin film of Au, or Cr then Au, on one side of the die. Usually, the bonding pad of the ceramic package has an area of low melting Au paste and, this low melting Au paste, or Au alloy, such as Au—Si or Au—Ge, is sandwiched between the bond pad and the backside of the die and the two are subjected to a heat cycle plus ultrasonic energy to firmly attach the die to the pad.

Presently this prior art technique has been found deficient because of premature separation of the die and from the bonding pad which results in a functional failure of the integrated circuit chip. In other cases, the bond, being sufficiently weak, will result in a separation between the die and the pad when the package is subjected to shock, etc. The cause of the low bond strength is often found to be poor wettability (bondability) of the conductor material (usually Au) on the die. An Auger depth profile analysis of this metallization often shows considerable $SiO_2$ on the surface of the Au especially after the heat treatment step for attaching the die to the bonding pad. It appears that the Si diffuses through the Au where oxidation takes place, thus reducing the wettability of the Au. It has been observed that this oxide can grow at about 1000 Å per minute at 375° C.

This means that a continuous oxide non-wettable surface can form in only a few seconds at 375° C. To reduce the rate of this Si diffusion, a Cr layer has been employed as a barrier layer between the Si and the Au; however, it has been observed that movement of the Cr through the Au, in addition to the Si movement, occurs after about 3 minutes at 375° which still results in a non-wettable surface.

Another negative aspect of the prior art process is the need for larger amounts of Au to be used due to this diffusion of the Si to the surface of the Au where the oxidation takes place. It is almost as if large amounts of Au disappear into the barrier layer and Si layer.

It is, therefore, a prinicipal object of this invention to improve the properties of integrated circuits by increasing the wettability of conductive material in the process of manufacturing these circuits.

Another specific object of this invention is to provide a method of manufacture of integrated circuits which improves the strength and reliability of the die attachment metallization technique.

Still another and more specific object of this invention is to obtain a reduction in Au usage in the die attachment metallization technique and permit other less expensive bondable materials such as silver, or silver alloys to be used.

SUMMARY OF THE INVENTION

The invention which attains the foregoing objects as an improvement over the prior art comprises a process in the manufacture of integrated circuit dice comprising the steps of depositing a barrier layer of Cr, 50–500 nm in thickness, on a Si die surface, said Cr being deposited in a partial atmosphere of $N_2$ in the sputtering gas so that $N_2$ is incorporated into the Cr, either in its grain boundary regions, or as CrN, and then depositing a conductor layer, 50–500 nm in thickness, over the nitrided Cr. This structure provides a wettable conductive material which results in a greater bond strength and greater reliability after the die is attached to the bonding pad by the conventional heat treating process.

From the foregoing, it can be seen that the Au film thickness can be reduced to 50–100 nm in thickness from that of the prior art with the result that there is considerable cost savings over the prior art method of die attachment. Additionally, a further cost savings is achievable utilizing less expensive conductive material such as low temperature eutectics or other high temperature solders in the place of Au.

Other and additional objects and again, additional applications of the invention will become apparent to those skilled in the art after a study of the drawings and the following detailed description of the invention.

DETAILED DESCRIPTION

Figure 1:
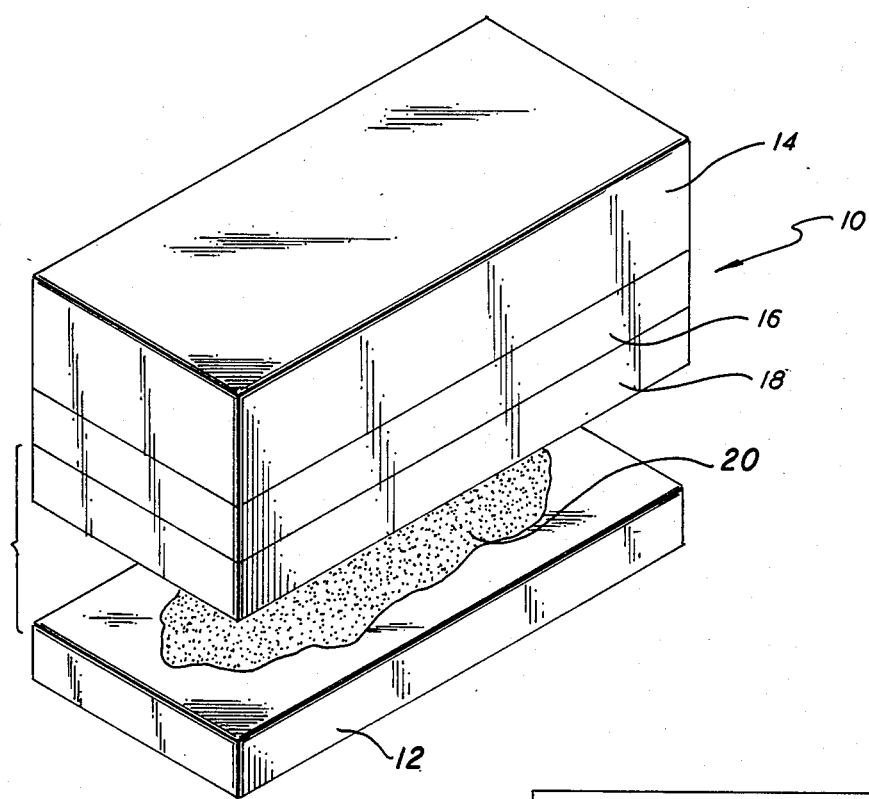
FIG. 1 is an exploded view showing schematically different layers for attachment of a die to a bonding pad of a ceramic package.

Turning now to FIG. 1, there is shown a die or chip 10, one side of which is to be bonded and connected to a bonding pad 12; the latter forming a part of a ceramic package to contain the die. The die and package are provided with conductors (not shown) for connecting the package and die to other electrical components. The attachment side of the die is shown to have a surface 14 of Si, a barrier layer 16 which, according to this invention, comprises $N_2$ incorporated in the Cr, either as CrN or as $N_2$ residing in the grain boundary regions of the Cr. Deposited on the barrier layer is a conductive material 18 such as Au, silver, or low temperature eutectics.

This layered structure is brought into contact with the bonding pad 12 which itself is provided with an Au paste 20, such as a low melting Au alloy, either AuSi or AuGe, and the two structures are subjected to a heat cycle and ultrasonic energy at about 375° C. to firmly attach the die to the bonding pad.

The barrier in the prior art was a layer of Cr which was used to reduce the rate of diffusion of the Si through and over the Au, but even this allowed an oxidized layer on the Au either as $SiO_2$ or $Cr_2O_3$. This invention, on the other hand, provides a barrier which contains $N_2$ either in the form of CrN, or $N_2$ residing in the grain boundary regions of the Cr, which reduces the migration of the Si to and through the Au to insure good wettability of the Au. This is accomplished by the following inventive process.

Figure 2:
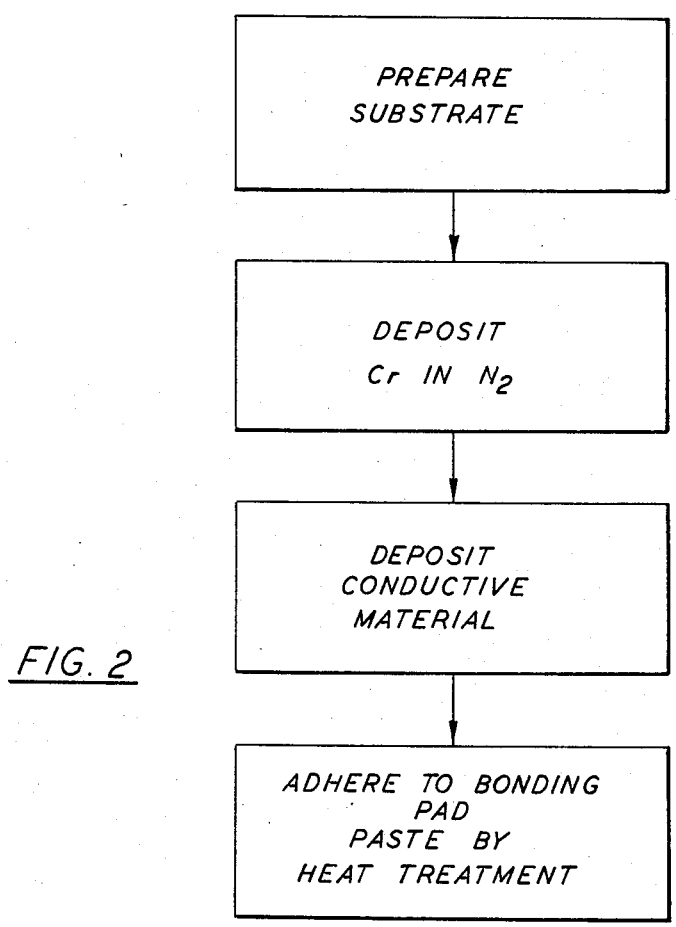
FIG. 2 is a simplified flow chart showing the process of this invention.

Reference should be made to FIG. 2.

The die 10 is placed in a conventional sputtering apparatus (not shown) in which the Cr layer as a barrier layer is sputtered onto the Si in a partial atmosphere of $N_2$ utilizing Ar as the sputtering gas so that the $N_2$ is incorporated into the Cr as it is being sputtered. Finally, the layer of silver, or other low temperature metals or high temperature solders, are deposited onto the barrier layer.

Thereafter, the prepared bonding pad is placed in contact with the Au and the two are subjected to a high temperature of about 375° for 3 minutes to bond or solder the two surfaces together.

As foresaid, utilizing this method, a wettable conductive material is provided which permits a reliable electrical and physical connection between the bonding pad and the conductive material and premature separation of the die from the pad is reduced when the package is subjected to tests or shocks, etc.

Figure 3:
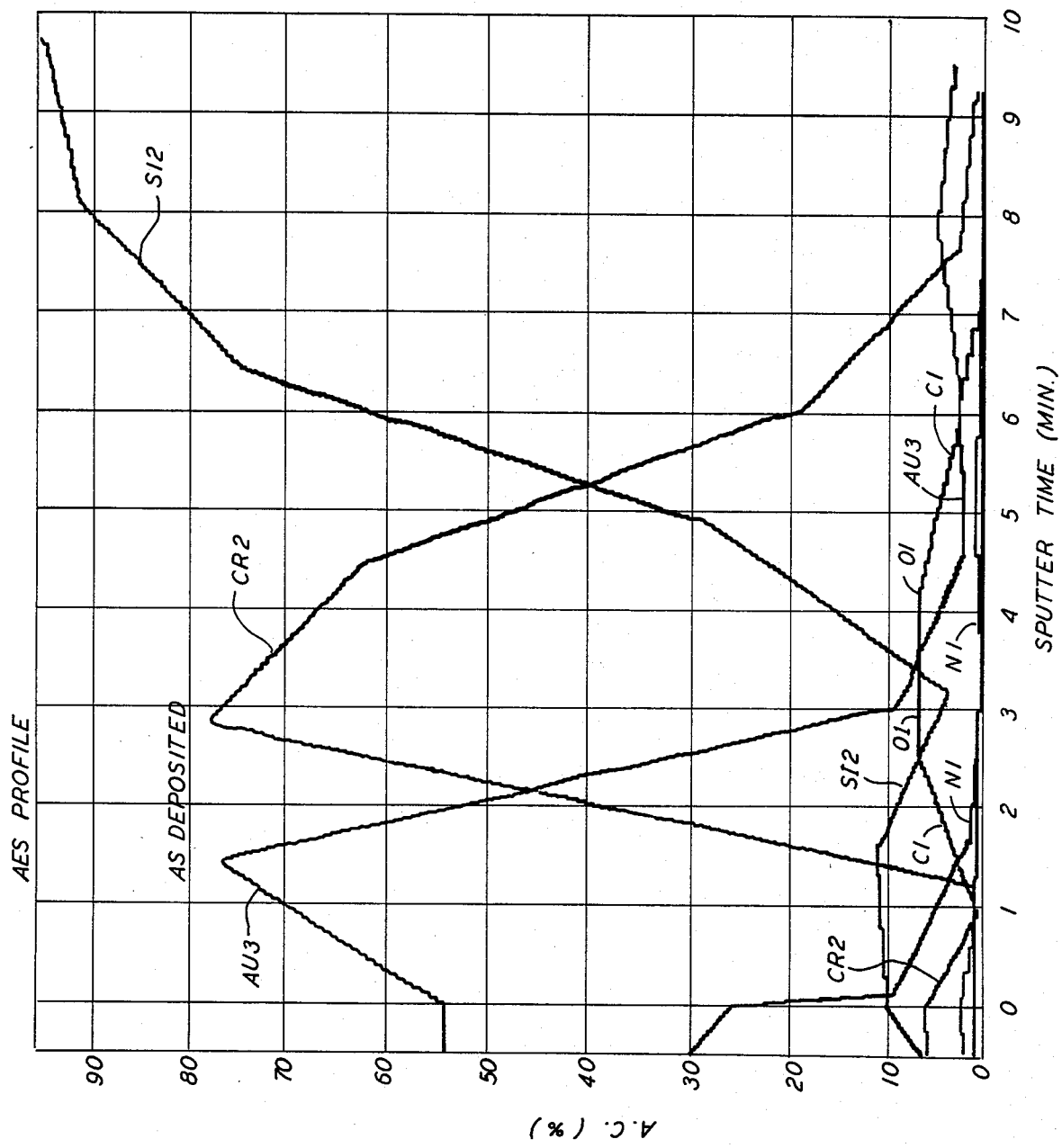
FIG. 3 is an Auger analysis of the layers of material in the prior art method of sputtering layers onto the die *before* the heat treating step.

FIG. 3 is an Auger electron scan profile of the layers deposited by sputtering plotted in sputtering time versus atomic concentration with the layers identified as lines identified by their chemical symbols. This scan is of the deposited layers before heat treating for bonding the layers to the bonding pad.

Figure 4:
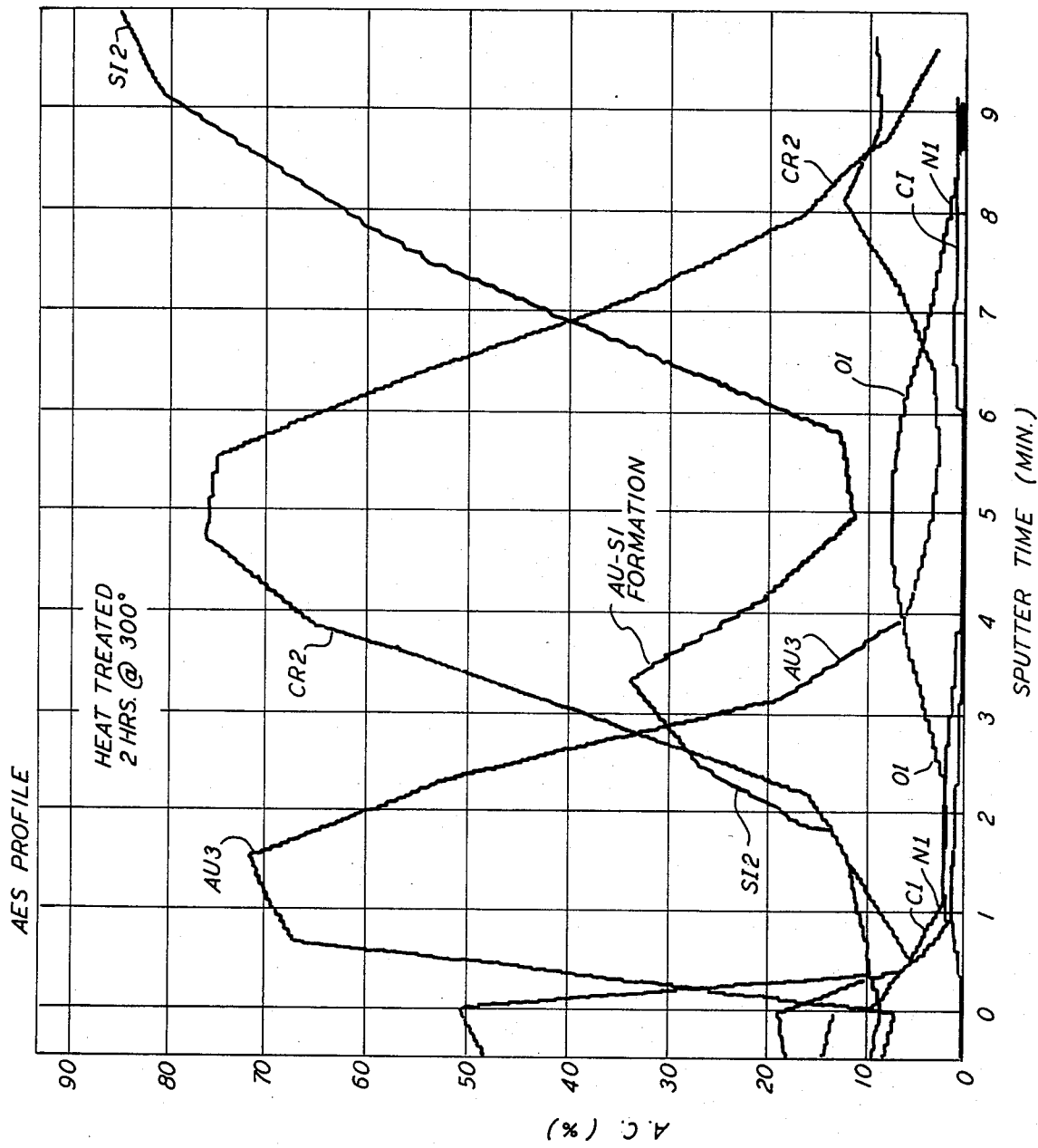
FIG. 4 is an Auger analysis of the same layers of material *after* the heat treating step.

FIG. 4, on the other hand, is the same type profile of the same layers after the heat treating step and shows clearly the shifting or inter-diffusion of the layers, caused by the heating. The formation of the AuSi is shown at a peak 3.3, on the sputter time scale and approximately 33 on the A.C. scale.

Figure 5:
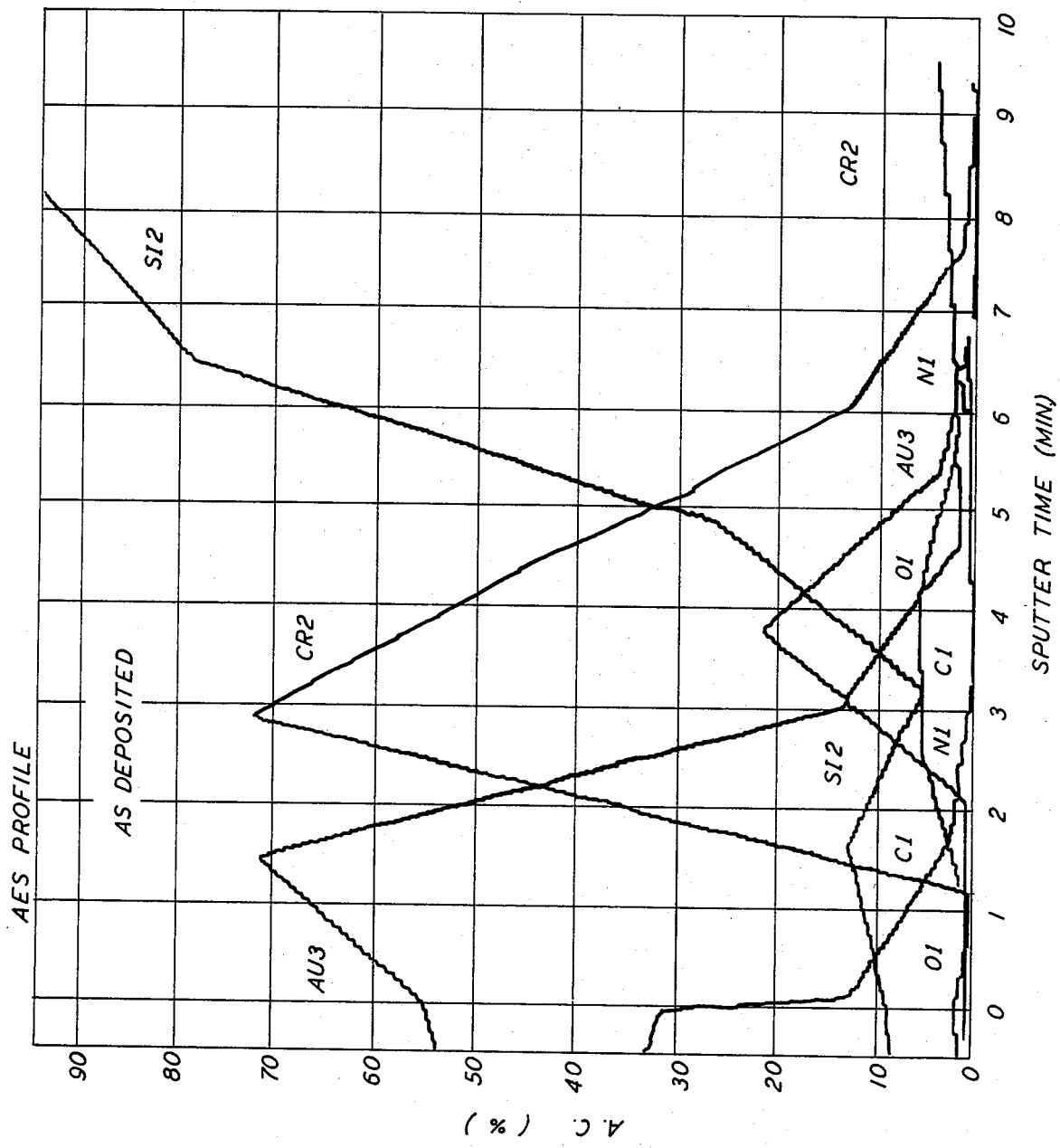
FIGS. 5 and 6 show the same analyses as in FIGS. 3 and 4 when the present invention is utilized.
Figure 6:
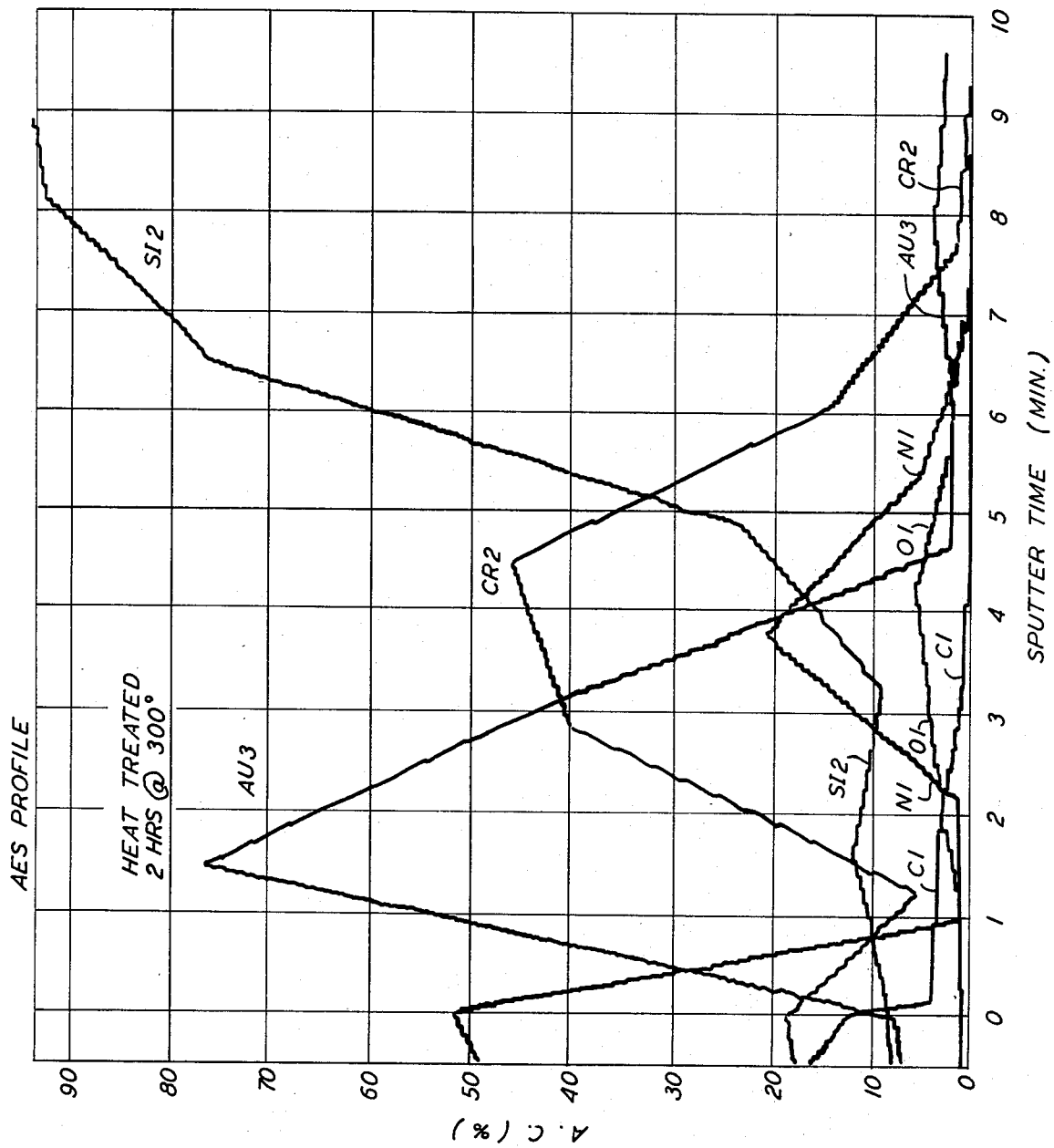

FIG. 5 is another Auger scan of another die with the layers deposited on the die in a manner similar of FIG. 3, but with the Cr deposited in the presence of $N_2$. This layer is shown to peak at about 3.7 or 3.8 on the sputter time scale and about 22 on the A.C. scale. FIG. 6, on the other hand, shows the lack of the migration of the Si after heat treatment where the barrier has been deposited in the presence of $N_2$. The Si remains almost the same as in FIG. 5 indicating little or no diffusion through the Au. Compare this with FIG. 4.

From the foregoing it can be seen that the inventive method of depositing a barrier layer of Cr (or other material material such as titanium, titanium alloy, or titanium plus refractory metals) in the presence of $N_2$ reduces the diffusion of the Si through the conductive material and prevents the oxidation layers from forming over the conductive material during later high temperature process steps in the manufacture of integrated circuits. With this accomplished, it can be appreciated that a reduction in film thickness of the conductive material, i.e., Au and the use of other less expensive conductive materials may be used.

What is claimed is:

1. In the process of fabricating integrated circuits and other items where a wettable or bondable conductive material is required for reliable contact with other bondable or conductive material, the steps of forming a conductive or bondable layer comprising:

depositing a metal barrier layer on a prepared Si surface, said barrier layer being formed in the presence of $N_2$ so that $N_2$ is incorporated into the barrier layer;

depositing a layer of conductive or bondable material on said barrier layer and subjecting said surface and layers to high temperature, said barrier layer thus formed reduces migration of the Si through the conductive or bondable material to provide said wettable bonding material after the subjection of said layers to high temperature.

2. The process as claimed in claim 1 wherein said barrier layer is formed of Cr.

3. The process as claimed in claim 2 wherein said deposition steps comprise sputtering in a sputtering apparatus.

4. The process as claimed in claim 3 wherein said barrier layer is formed by sputtering with a low atmosphere of $N_2$ in a sputtering gas.

5. The process as claimed in claim 4 wherein said conductive material is Au.

6. The process as claimed in claim 4 wherein the conductive material is silver or silver alloy.

7. The process as claimed in claim 4 wherein said conductive material is a eutectic alloy of semi-precious metals.

8. The process as claimed in claim 4 wherein said conductive material is a high melting temperature solder.

9. The process as claimed in claim 4 wherein said barrier metal is titanium.

10. The process as claimed in claim 4 wherein said barrier metal is a titanium alloy.

11. The process as claimed in claim 4 wherein said barrier metal is titanium plus refractory metals.

12. A method of fabricating integrated circuits and the like, in part performed in a sputtering apparatus, comprising:

providing a Si surface, sputtering a barrier layer of a metal selected from the group consisting of chromium, titanium, titanium alloy or titanium plus refractory metals in the low atmospheric chamber of said sputtering apparatus which atmosphere includes $N_2$ thereby incorporating $N_2$ in said barrier layer, sputtering a layer of conductive material on said barrier layer, placing a bonding pad with a solder on one surface in contact with said conductive material, and heating said layered material and pad to bond the layered material and pad together, the barrier layer reducing the migration of Si through the conductive material during the heating step so that the conductive material adheres to the pad.

* * * * *